(12) United States Patent
Tu

(10) Patent No.: US 8,659,967 B2
(45) Date of Patent: Feb. 25, 2014

(54) RANDOM ACCESS MEMORY AND REFRESH CONTROLLER THEREOF

(75) Inventor: Ying-Te Tu, Kaohsiung (TW)

(73) Assignee: Windbond Electronics Corp., Taichung (TW)

( * ) Notice: Subject to any disclaimer, the term of this patent is extended or adjusted under 35 U.S.C. 154(b) by 230 days.

(21) Appl. No.: 13/329,337

(22) Filed: Dec. 19, 2011

(65) Prior Publication Data

US 2013/0155782 A1 Jun. 20, 2013

(51) Int. Cl.
*G11C 7/00* (2006.01)
(52) U.S. Cl.
USPC ..................... 365/222; 365/189.05
(58) Field of Classification Search
USPC ..................... 365/222, 189.05, 196
See application file for complete search history.

(56) References Cited

U.S. PATENT DOCUMENTS

2004/0199717 A1* 10/2004 Kanda et al. .................. 711/106
2006/0203607 A1* 9/2006 Takatsuka et al. ......... 365/233.5

* cited by examiner

*Primary Examiner* — Vu Le
(74) *Attorney, Agent, or Firm* — Jianq Chyun IP Office

(57) ABSTRACT

A random access memory and a refresh controller thereof are provided. The refresh controller includes a write action detector, a latch device, a reset circuit, and a refresh masking device. The write action detector is coupled to an address decoder of the random access memory, and is used to detect a write action in an address corresponding to the address decoder and generate a detection result. The latch device is coupled to the write action detector, and is used to receive and latch the detection result. The reset circuit is coupled to the latch device, receives a reset control signal, and resets the detection result according to the reset control signal. The refresh masking device is coupled to a corresponding word line control circuit and the latch device and is used to mask a refresh action on the word line control circuit according to the detection result.

14 Claims, 3 Drawing Sheets

RANDOM ACCESS MEMORY AND REFRESH CONTROLLER THEREOF

BACKGROUND OF THE INVENTION

1. Field of the Invention

The present invention generally relates to a refresh controller and a random access memory.

2. Description of Related Art

In a conventional dynamic random access memory (DRAM), a refresh action needs to be performed on one or more memory blocks thereof according to a refresh command from a refresh controller of the memory, so as to supplement new electric charge. Moreover, the refresh action on all the memory blocks needs to be completed in a fixed period of time; otherwise, data is likely to be lost. In addition, considering a requirement of low energy consumption on the memory, it is also proposed in the prior art that only memory blocks having access data are refreshed, so as to reduce the energy consumption of the refresh action. However, so long as a small part of a memory block has storage data, the entire memory block needs to be refreshed in such a refresh action in the prior art, and therefore great electric power consumption is still generated.

SUMMARY OF THE INVENTION

The present invention is directed to a refresh controller for reducing power consumption generated in a refresh action.

The present invention is further directed to a random access memory for reducing power consumption generated in a refresh action.

The present invention provides a refresh controller applicable to a random access memory. The refresh controller includes a write action detector, a latch device, a reset circuit, and a refresh masking device. The write action detector is coupled to an address decoder of the random access memory, and is used to detect a write action in an address corresponding to the address decoder and generate a detection result. The latch device is coupled to the write action detector, and is used to receive and latch the detection result. The reset circuit is coupled to the latch device, receives a reset control signal, and resets the detection result according to the reset control signal. The refresh masking device is coupled to a word line control circuit corresponding to the address and the latch device, and is used to mask a refresh action on a word line according to the detection result.

The present invention further provides a random access memory, which has a plurality of word lines, and the random access memory includes a plurality of refresh controllers. The refresh controller includes a write action detector, a latch device, a reset circuit, and a refresh masking device. The write action detector is coupled to an address decoder of the random access memory, and is used to detect a write action in an address corresponding to the address decoder and generate a detection result. The latch device is coupled to the write action detector, and is used to receive and latch the detection result. The reset circuit is coupled to the latch device, receives a reset control signal, and resets the detection result according to the reset control signal. The refresh masking device is coupled to a word line control circuit corresponding to the address and the latch device, and is used to mask a refresh action on a word line according to the detection result.

Based on the above, the present invention provides a refresh controller and a random access memory. Through detecting a write action in a memory cell of a work line, the refresh controller determines whether to refresh the memory cell of the word line. Hence, electric power consumption generated in the refresh action on the random access memory is reduced.

In order to make the aforementioned features and advantages of the present invention comprehensible, embodiments are described in detail below with reference to the accompanying drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
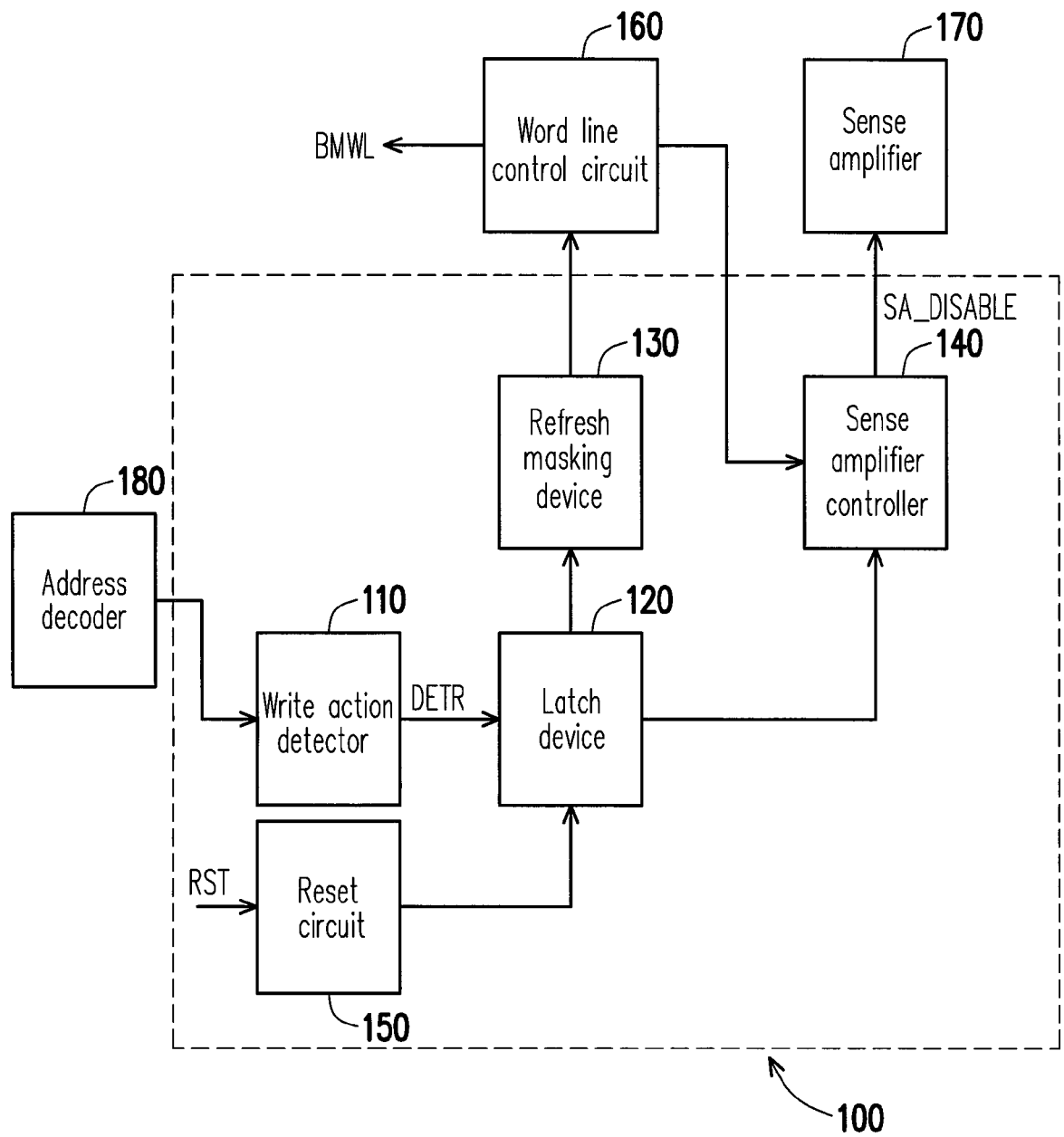
FIG. 1A is a function block diagram of a refresh controller 100 according to an embodiment of the present invention.

Reference will now be made in detail to the present embodiments of the invention, examples of which are illustrated in the accompanying drawings. Wherever possible, the same reference numbers are used in the drawings and the description to refer to the same or like parts.

FIG. 1A is a block diagram of a refresh controller 100 according to an embodiment of the present invention. Referring to FIG. 1A, the refresh controller 100 is coupled to a word line control circuit 160 of a random access memory, and determines whether to mask a refresh command on a memory cell executed by the word line control circuit 160 according to whether data is written into the memory cell of the random access memory corresponding to the word line control circuit 160. The refresh controller 100 includes a write action detector 110, a latch device 120, a refresh masking device 130, a sense amplifier controller 140 and a reset circuit 150. The write action detector 110 is coupled to an address decoder 180 of the random access memory, and is used to detect a write action in an address corresponding to the address decoder 180 and generate a detection result DETR. The latch device 120 is coupled to the write action detector 110, and is used to receive and latch the detection result DETR.

The reset circuit 150 is coupled to the latch device 120, receives a reset control signal RST, and resets the detection result DETR according to the reset control signal RST. In other words, at an initial power-on stage of the random access memory corresponding to the refresh controller 100 or when the random access memory needs to be initialized during operation, the detection result DETR may be reset through the reset circuit 150. Upon receiving the reset control signal RST, the reset circuit 150 clears the detection result DETR stored by the latch device 120 to, for example, a logic low level signal.

The refresh masking device 130 is coupled to the word line control circuit 160 and the latch device 120. The refresh masking device 130 receives the detection result DETR stored by the latch device 120, and masks the refresh action on the word line control circuit 160 according to the detection result DETR. That is to say, when the word line control circuit 160 corresponding to the address sends a refresh command, the refresh masking device 130 determines, according to the detection result DETR stored by the latch device 120, whether a memory cell corresponding to a word line bMWL generated by the word line control circuit 160 needs to be refreshed. When the word line bMWL is a low level of logic 0, the word line bMWL is enabled to execute the refresh command. When the word line bMWL is a high level of logic 1, the word line bMWL is disabled, and the refresh command is not executed. Therefore, if the refresh does not need to be executed, the refresh masking device 130 masks the word line control circuit 160, and generates a disable word line signal on the word line bMWL, so as to mask the refresh command executed on the memory cell of the word line bMWL.

In addition, the refresh controller 100 further includes the sense amplifier controller 140. The sense amplifier controller 140 is coupled to the latch device 120, and is used to receive the detection result DETR stored by the latch device 120 and disable or enable a sense amplifier 170 corresponding to the word line control circuit 160 according to the detection result DETR stored by the latch device 120. For example, the sense amplifier controller 140 decides a logic voltage level of a generated sense amplifier start signal SA_DISABLE according to the detection result DETR stored by the latch device 120. When the sense amplifier start signal SA_DISABLE is at the low level of logic 0, the sense amplifier start signal SA_DISABLE is in an enable state, so as to enable the sense amplifier 170. When the sense amplifier start signal SA_DISABLE is at the high level of logic 1, the sense amplifier start signal SA_DISABLE is in a disable state, and the sense amplifier 170 is stopped. Therefore, when the detection result DETR stored by the latch device 120 indicates that data is not written into the memory cell on the word line bMWL, the sense amplifier controller 140 generates, for example, the sense amplifier start signal SA_DISABLE of logic high level to stop an action of the sense amplifier 170. Correspondingly, when the detection result DETR stored by the latch device 120 indicates that data is written into the memory cell on the word line bMWL, the sense amplifier controller 140 generates, for example, the sense amplifier start signal SA_DISABLE of logic low level to enable the sense amplifier 170.

It should be noted that the relationship between the logic high/low level of the sense amplifier start signal SA_DISABLE and the enable of the sense amplifier 170 is merely an example. Persons of ordinary skill in the art know that the relationship between the logic high/low level of the sense amplifier start signal SA_DISABLE and the enable of the sense amplifier 170 may be defined by a designer according to actual requirements.

Figure 1B:
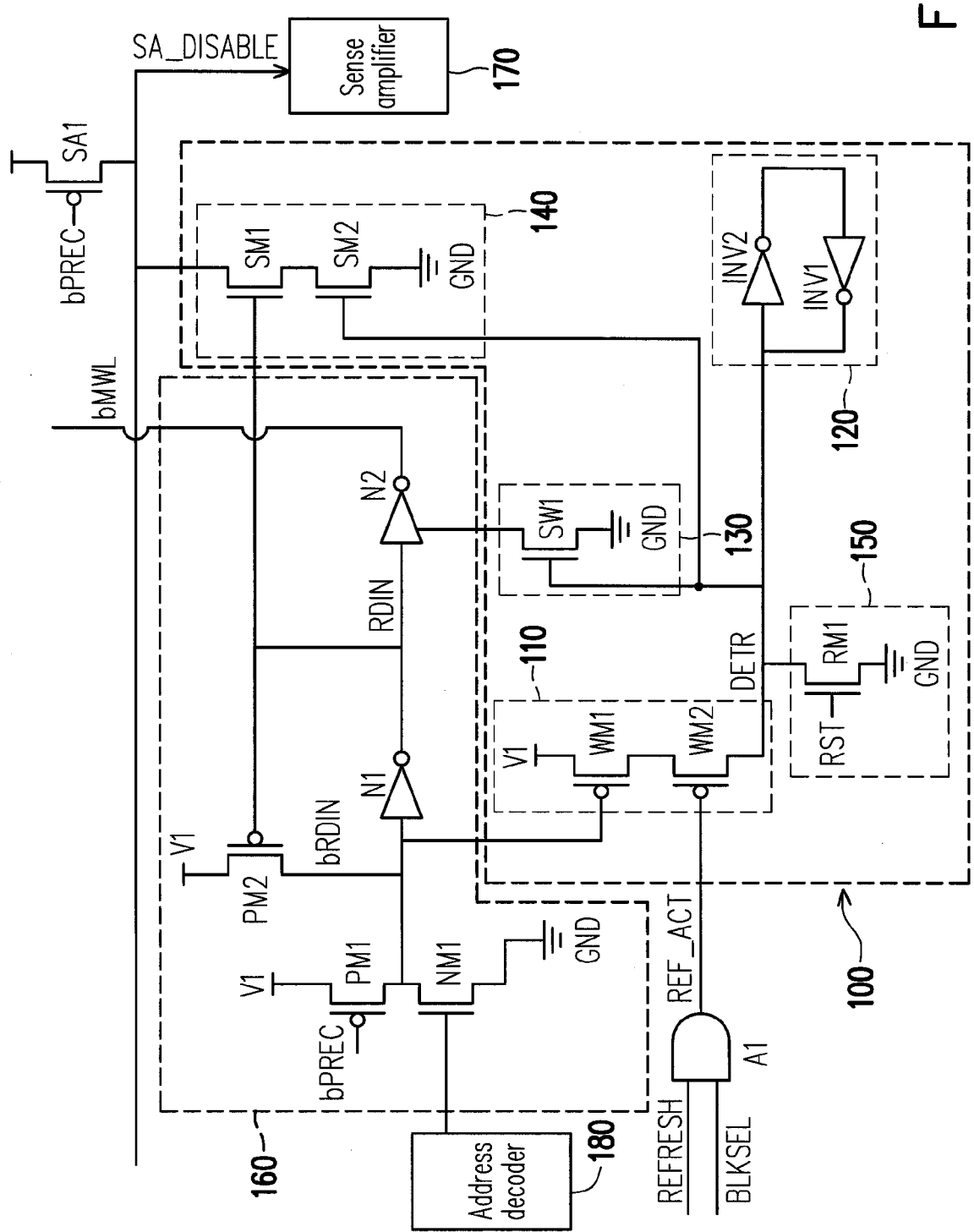
FIG. 1B is a schematic circuit diagram of a refresh controller 100 according to an embodiment of the present invention.

Referring to FIG. 1B, FIG. 1B is a schematic circuit diagram of a refresh controller 100 according to an embodiment of the present invention. Through the word line control circuit 160, the refresh controller 100 may control whether to generate an enable word line signal for the word line bMWL. The word line control circuit 160 includes P-type transistors PM1 and PM2, N-type transistors NM1 and NM2, and buffers N1 and N2. The word line control circuit 160 receives a decoding signal from the address decoder 180, so as to output a write signal bRDIN and a sense write signal RDIN, and generates the disable/enable word line signal on the word line bMWL through the buffers N1 and N2.

With respect to action details of the refresh controller 100, the write action detector 110 includes transistors WM1 and WM2. The transistor WM1 has a first end (for example, a source), a second end (for example, a drain), and a control end (for example, a gate). The first end of the transistor WM1 receives a power source voltage V1, and the control end receives the write signal bRDIN. The transistor WM2 has a first end (for example, a source), a second end (for example, a drain), and a control end (for example, a gate). The first end of the transistor WM2 is coupled to the second end of the transistor WM1. The control end of the transistor WM2 receives a refresh start signal REF_ACT. The second end of the transistor WM2 generates the detection result DETR. When data is written into the memory cell of the word line bMWL, the write signal bRDIN is pulled down to the low level, and the P-type transistor WM1 is conducted. The refresh command is not started at this time, so the refresh start signal REF_ACT maintains at the low level, and therefore, the P-type transistor WM2 is conducted. Through the conduction of the P-type transistors WM1 and WM2, the power source voltage V1 is transferred to the second end of the transistor WM2, and the detection result DETR is pulled up to the logic high level. Meanwhile, the latch device 120 latches the detection result DETR of logic high level.

In another aspect, if the memory cell corresponding to the address needs to be refreshed, the refresh start signal REF_ACT is pulled up to the high level, and the P-type transistor WM2 is disconnected. In this embodiment, the refresh start signal REF_ACT is generated by an AND gate A1 according to a refresh indication signal REFRESH and a block selection signal BLKSEL, in which when the memory block of the word line bWML is selected to be refreshed, the refresh indication signal REFRESH and the block selection signal BLKSEL are both controlled to be the logic high level.

The latch device 120 includes inverters INV1 and INV2. An input end of the inverter INV2 is coupled to an output end of the inverter INV1, and receives the detection result DETR. In addition, an output end of the inverter INV2 is coupled to an input end of the inverter INV1. The latch device 120 latches the received detection result DETR through the inverters INV1 and INV2 that are cascaded to form a loop. It should be noted that a driving capability generated by the inverter INV1 is lower than a driving capability generated by the reset circuit 150 and the write action detector 110.

The reset circuit 150 includes a pull-down transistor RM1. The pull-down transistor RM1 has a first end (for example, a source), a second end (for example, a drain), and a control end (for example, a gate). The first end of the pull-down transistor RM1 receives the detection result DETR, the control end thereof receives the reset control signal RST, and the second end thereof receives a ground voltage GND. When the pull-down transistor RM1 receives the reset control signal RST of logic high level, the transistor RM1 is conducted. At this time, the ground voltage GND is transferred to the first end of the pull-down transistor RM1, and the detection result DETR is pulled down to the logic low level equal to the ground voltage GND.

The refresh masking device 130 may be constructed by using a transistor switch SW1. The transistor switch SW1 is cascaded on a path through which the buffer N2 of the word line control circuit 160 receives the ground voltage GND. The transistor switch SW1 is controlled by the detection result DETR, and conducts or cuts off the path through which the ground voltage GND is provided to the buffer N2 according the detection result DETR. When the path through which the ground voltage GND is provided to the buffer N2 is cut off, the buffer N2 fails to act normally to enable the word line signal on the word line bMWL. In another aspect, the above ground voltage GND of the refresh masking device 130 may also be replaced by the power source voltage V1.

The sense amplifier controller 140 includes transistors SM1 and SM2, and the transistor SM1 has a first end (for example, a drain), a second end (for example, a source), and a control end (for example, a gate). The first end of the transistor SM1 is coupled to the sense amplifier start signal SA_DISABLE, and the control end of the transistor SM1 receives the sense write signal RDIN from the word line control circuit 160. The transistor SM2 has a first end (for example, a drain), a second end (for example, a source), and a control end (for example, a gate). The first end of the transistor SM2 is coupled to the second end of the transistor SM1. The control end of the transistor SM2 receives the detection result DETR, and the second end thereof is coupled to the ground voltage GND. When the control end of the transistor SM2 receives the detection result DETR of high level, it indicates that the write action has occurred, and the ground voltage GND is conducted to the second end of the transistor SM1. The transistor SM1 is conducted or cut off according to the sense write signal RDIN. If the transistor SM1 receives the sense write signal RDIN of high level, the ground voltage GND is conducted to the first end of the transistor SM1, and the sense amplifier start signal SA_DIS-ABLE is pull down to the logic low level equal to the ground voltage GND. In another aspect, if the write action has not occurred, as the sense amplifier 170 of the memory cell where data is not written in does not need to act, the detection result DETR is at the logic low level, so that the transistor SM2 is disconnected, and an amplifier disable signal SA_DISABLE cannot be pulled down to be equal to the ground voltage.

As is described above, when the refresh controller 100 is initialized, the latch device 120 latches data equal to the ground voltage GND through the reset control signal RST of logic high level. At this time, data is not written into the memory cell corresponding to the word line bMWL. Therefore, if the refresh command is executed on the word line bMWL, the word line signal on the word line bMWL cannot be effectively enabled as the refresh masking device 130 cuts off the path through which an operating power source of the buffer N2 is provided, and therefore, the refresh action on the word line bMWL can be masked effectively.

Meanwhile, as data is not written into the memory cell corresponding to the word line bMWL, the sense amplifier 170 does not require any action either. According to the data equal to the ground voltage GND latched by the latch device 120, the transistor SM2 of the sense amplifier controller 140 is in a disconnected state. In this state, a voltage of the sense amplifier start signal SA_DISABLE that is pre-charged to the logic high level previously according to a pre-charge signal bPREC received by a transistor SA1 cannot be pulled down effectively, and therefore, the sense amplifier 170 is continuously in a closed state.

Correspondingly, when data is written into the memory cell corresponding to the word line bMWL, the latch device 120 latches data equal to the power source voltage V1. At this time, the refresh masking device 130 recovers the path through which the operating power source of the buffer N2 is provided. Therefore, the word line bMWL may be driven normally according to the start of the refresh operation. Meanwhile, the transistor SM2 of the sense amplifier controller 140 is conducted. In this manner, the voltage of the sense amplifier start signal SA_DISABLE being pre-charged to the logic high level is effectively pulled down to be equal to the ground voltage GND through the conducted transistors SM1 and SM2. In such a condition, the sense amplifier 170 may act normally.

Figure 2:
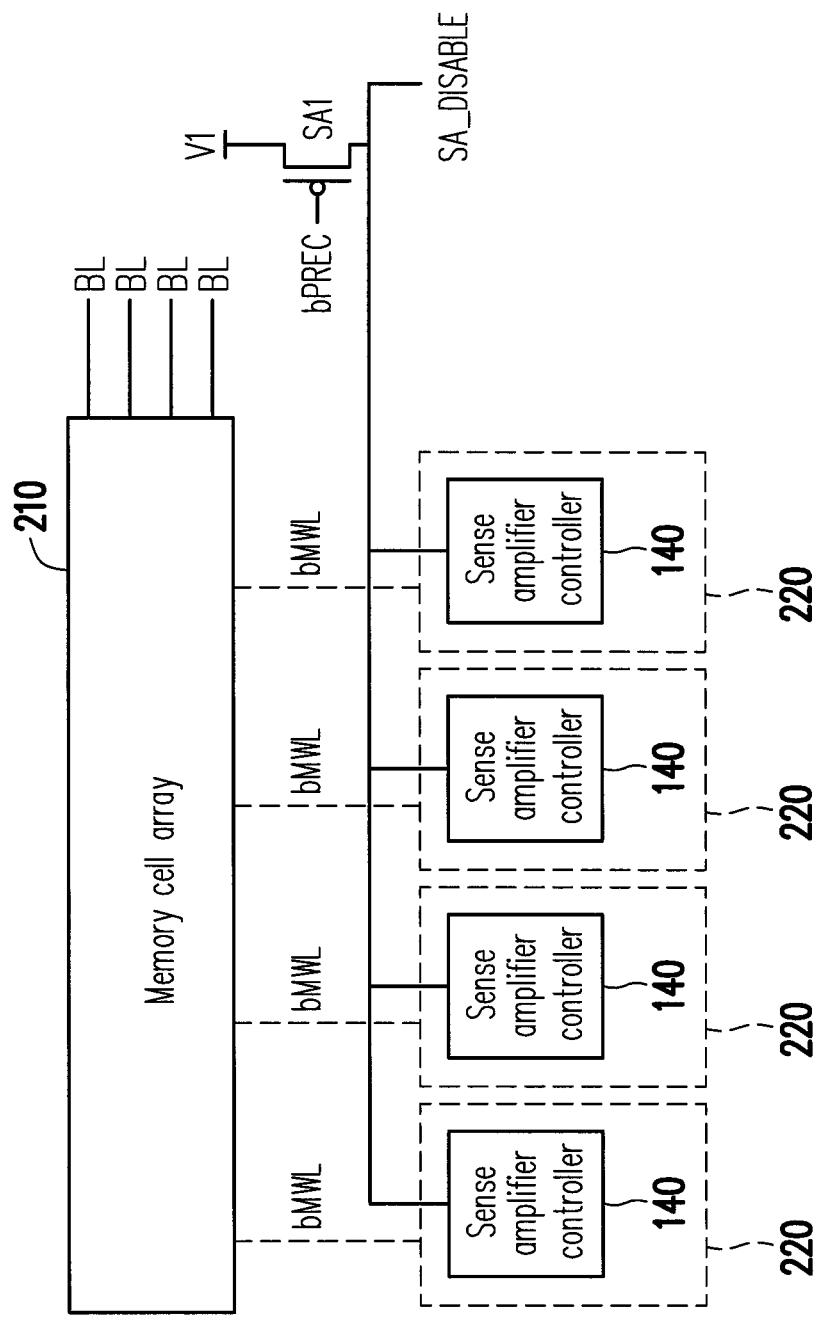
FIG. 2 is a schematic view of a random access memory 200 according to an embodiment of the present invention.

Referring to FIG. 2, FIG. 2 is a schematic view of a random access memory 200 according to an embodiment of the present invention. The random access memory 200 includes a plurality of word lines bMWL, a plurality of bit lines BL, and a memory cell array 210, and also includes a plurality of refresh controllers 220, in which the plurality of refresh controllers 220 respectively includes a sense amplifier controller 140. The plurality of sense amplifier controllers 140 is coupled to a drain of a transistor SA1, so as to generate a sense amplifier start signal SA_DISABLE, and the transistor SA1 receives a pre-charge signal bPREC for pre-charging. In the random access memory 200 of this embodiment, the plurality of refresh controllers 220 is coupled to the memory cell array 210. The refresh controller 220 decides whether to mask a refresh action and disable the sense amplifier controller 140 according to whether data is written into a memory cell in the memory cell array 210 corresponding to the word line bMWL connected to the refresh controller 220. A detailed implementation manner of the refresh controller 220 is the same as that of the refresh controller 100 of the foregoing embodiment, and details are not described herein again.

Based on the above, the present invention provides a refresh controller and a random access memory, which decide whether to refresh a memory cell corresponding to a word line according to the detection of a write action in the memory cell corresponding to the word line, thereby reducing energy consumption in a refresh action on the random access memory. In addition, a sense amplifier controller is adopted to disable or enable a sense amplifier, which further reduces the energy consumption during operation of the random access memory.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A refresh controller, applicable to a random access memory, comprising:
   a write action detector, coupled to an address decoder of the random access memory, and used to detect a write action in an address corresponding to the address decoder and generate a detection result;
   a latch device, coupled to the write action detector, and used to receive and latch the detection result;
   a reset circuit, coupled to the latch device, and used to receive a reset control signal and reset the detection result according to the reset control signal; and
   a refresh masking device, coupled to a word line control circuit corresponding to the address and the latch device, and used to mask a refresh action on a word line of the random access memory according to the detection result.

2. The refresh controller according to claim 1, further comprising:
   a sense amplifier controller, coupled to the latch device, and used to receive the detection result to disable or enable a sense amplifier corresponding to the word line according to the detection result.

3. The refresh controller according to claim 2, wherein the sense amplifier controller is coupled to a sense amplifier start signal, and the sense amplifier controller comprises:
   a first transistor, comprising a first end, a second end, and a control end, wherein the first end is coupled to the sense amplifier start signal, and the control end is coupled to the word line control circuit; and
   a second transistor, comprising a first end, a second end, and a control end, wherein the first end is coupled to the second end of the first transistor, the control end receives the detection result, and the second end is coupled to a ground voltage.

4. The refresh controller according to claim 1, wherein the write action detector comprises:

a first transistor, comprising a first end, a second end, and a control end, wherein the first end receives a power source voltage, and the control end receives a write signal; and a second transistor, comprising a first end, a second end, and a control end, wherein the first end is coupled to the second end of the first transistor, the control end receives a refresh start signal, and the second end of the second transistor generates the detection result.

5. The refresh controller according to claim 1, wherein the latch device comprises:

a first inverter, comprising an output end receiving the detection result; and a second inverter, comprising an input end coupled to the output end of the first inverter, and an output end coupled to an input end of the first inverter.

6. The refresh controller according to claim 1, wherein the reset circuit comprises:

a pull-down transistor, comprising a first end, a second end, and a control end, wherein the first end receives the detection result, the control end receives the reset control signal, and the second end receives a ground voltage.

7. The refresh controller according to claim 1, wherein the refresh masking device comprises:

a transistor switch, coupled to a buffer that is coupled to the word line, wherein the transistor switch is controlled by the detection result, and conducts or cuts off a path through which at least one of a power source voltage or a ground voltage is provided to the buffer according to the detection result.

8. A random access memory with a plurality of word lines, comprising:

a plurality of refresh controllers, wherein the refresh controllers are respectively coupled to the word lines, and each of the refresh controllers comprises:

a write action detector, coupled to an address decoder of the random access memory, and used to detect a write action in an address corresponding to the address decoder and generate a detection result;

a latch device, coupled to the write action detector, and used to receive and latch the detection result;

a reset circuit, coupled to the latch device, used to receive a reset control signal, and reset the detection result according to the reset control signal; and a refresh masking device, coupled to a word line control circuit corresponding to the addresses and the latch device, and used to mask a refresh action on the word line corresponding to the address according to the detection result.

9. The random access memory according to claim 8, further comprising:

a sense amplifier controller, coupled to the latch device, and used to receive the detection result to disable or enable a sense amplifier corresponding to the word line according to the detection result.

10. The random access memory according to claim 9, wherein the sense amplifier controller is coupled to a sense amplifier start signal, and the sense amplifier controller comprises:

a first transistor, comprising a first end, a second end, and a control end, wherein the first end is coupled to the sense amplifier start signal, and the control end is coupled to the word line control circuits; and a second transistor, comprising a first end, a second end, and a control end, wherein the first end is coupled to the second end of the first transistor, the control end receives the detection result, and the second end is coupled to a ground voltage.

11. The random access memory according to claim 8, wherein the write action detector comprises:

a first transistor, comprising a first end, a second end, and a control end, wherein the first end receives a power source voltage, and the control end receives a write signal; and a second transistor, comprising a first end, a second end, and a control end, wherein the first end is coupled to the second end of the first transistor, the control end receives a refresh start signal, and the second end of the second transistor generates the detection result.

12. The random access memory according to claim 8, wherein the latch device comprises:

a first inverter, comprising an output end receiving the detection result; and a second inverter, comprising an input end coupled to the output end of the first inverter, and an output end coupled to an input end of the first inverter.

13. The random access memory according to claim 8, wherein the reset circuit comprises:

a pull-down transistor, comprising a first end, a second end, and a control end, wherein the first end receives the detection result, the control end receives the reset control signal, and the second end receives a ground voltage.

14. The random access memory according to claim 8, wherein the refresh masking device comprises:

a transistor switch, coupled to a buffer that is coupled to the word lines, wherein the transistor switch is controlled by the detection result, and conducts or cuts off a path through which at least one of a power source voltage or a ground voltage is provided to the buffer according to the detection result.

* * * * *